(12) United States Patent
Maekawa

(10) Patent No.: US 8,132,458 B2
(45) Date of Patent: Mar. 13, 2012

(54) ACCELERATION SENSOR RESISTANT TO EXCESSIVE FORCE BREAKAGE

(75) Inventor: Shinji Maekawa, Shinjuku-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 435 days.

(21) Appl. No.: 12/424,054

(22) Filed: Apr. 15, 2009

(65) Prior Publication Data

US 2009/0282918 A1 Nov. 19, 2009

(30) Foreign Application Priority Data

May 13, 2008 (JP) ................................. 2008-125674

(51) Int. Cl.
*G01P 15/12* (2006.01)
*G01P 15/00* (2006.01)
(52) U.S. Cl. ................ 73/514.33; 73/514.21; 73/514.38
(58) Field of Classification Search ............... 73/514.33, 73/514.21, 514.38
See application file for complete search history.

(56) References Cited

U.S. PATENT DOCUMENTS

| 6,772,632 B2 | 8/2004 | Okada | |
| 2004/0261529 A1* | 12/2004 | Yoshida et al. | 73/514.33 |

FOREIGN PATENT DOCUMENTS

| CN | 1576852 | 2/2005 |
| JP | 6-076867 | * 10/1994 |
| JP | 6-76867 | 10/1994 |
| JP | 2003-329702 A1 | 11/2003 |
| JP | 2004-144598 A1 | 5/2004 |
| JP | 2006-317242 | 11/2006 |

OTHER PUBLICATIONS

Machine Translation of JP6-076867, Publication date of JP6-076867: Oct. 28, 1994, Translation date: Aug. 10, 2011, Publisher: AIPN, Advanced Industrial Property Network, National Center for Industrial Property Information and Training, Japan Patent Office.*

* cited by examiner

*Primary Examiner* — Lisa Caputo
*Assistant Examiner* — Roger Hernandez-Prewitt
(74) *Attorney, Agent, or Firm* — Burr & Brown

(57) ABSTRACT

An acceleration sensor having a high impact resistance to prevent breakage under excessive acceleration, but can stably exert a sensing performance. The acceleration sensor is formed of an SOI substrate of a three-layered structure including a silicon layer (active layer silicon), a silicon oxide layer, and a silicon layer (substrate silicon). The acceleration sensor includes frame parts, a plurality of beam parts, the beam parts projecting inward from the frame part, and a weight part supported by the beam parts. A strain sensing part is provided on each of the beam parts. A width W of each of the beam parts, a length l of each of the beam parts, and an inner frame length L of the frame part satisfy the following relationships of Expressions (1) and (2).

$2 < L/l \leq 2.82$      Expression (1)

$l/W \leq 3.68$      Expression (2)

6 Claims, 6 Drawing Sheets

(A)

(B)

(C)

(D)

ACCELERATION SENSOR RESISTANT TO EXCESSIVE FORCE BREAKAGE

CROSS REFERENCE TO RELATED APPLICATIONS

This application is based upon and claims the benefit of priority from the prior Japanese Patent Application No. 2008-125674 filed on May 13, 2008, the entire contents of which are incorporated herein by reference.

FIELD OF THE INVENTION

The present invention relates to an acceleration sensor, more particularly to an acceleration sensor resistant to breakdown even when an excessive acceleration is applied thereto.

BACKGROUND OF THE INVENTION

Due to the recent development of small sensors with the use of the MEMS (Micro Electromechanical Systems) technique, sensors for sensing an acceleration are used in various instruments such as cell phones or game machines, or the use thereof is under review. Such an acceleration sensor is manufactured by using an SOI wafer of a three-layered structure including a silicon layer, a silicon oxide layer, and a silicon layer, for example. The sensor of this type includes a frame having an opening that is formed to pass through the SOI wafer, and a weight supported on the frame through a plurality of beams, the weight being displaceable when an external force acts thereon. When the weight is displaced by an external force (acceleration) acting thereon, the displacement is sensed so that the acceleration is measured. (See, Patent Documents 1 and 2.) Sensors for measuring an acceleration by sensing a displacement are classified into piezoresistance-type sensors in which a piezoresistors are arranged on beams and a resistance change by a strain of the beams is detected, and capacitance-type sensors in which a capacitance change in accordance with a displacement of a weight is detected.

[Patent Document 1] JP2003-329702A
[Patent Document 2] JP2004-144598A

In the aforementioned acceleration sensor, there is a possibility that, when an excessive acceleration is applied to the weight, the beams are excessively displaced and that the beams and/or the weight are broken down. For this reason, an acceleration sensor for use in a cell phone or the like is required to have an impact resistance against 3000 G. This is because an impact value applied to a wooden plate having a thickness of 100 mm is 1500 to 200 G, when the acceleration sensor is pulled down by gravity from a one-meter-high position toward the wooden plate.

However, in view of a wider variety of instruments on which the acceleration sensors are mounted, the acceleration sensor is now required to have an impact resistance against as high as 5000 G or more, but there is not yet obtained such an acceleration sensor having a high impact resistance.

SUMMARY OF THE INVENTION

The present invention has been made in view of the above circumstances. The object of the present invention is to provide an acceleration sensor having a high impact resistance, which will not be broken down when an excessive acceleration is applied thereto, but can stably exert a sensing performance.

The present invention is an acceleration sensor formed of an SOI substrate of a three-layered structure including a silicon layer (active layer silicon), a silicon oxide layer, and a silicon layer (substrate silicon), the acceleration sensor comprising: a frame part: a plurality of beam parts, the beam parts projecting inward from the frame part; and a weight part supported by the beam parts; wherein: each of the beam parts is provided with a strain sensing part; and a width W of each of the beam parts, a length I of each of the beam parts, and an inner frame length L of the frame part satisfy the following relationships of Expressions (1) and (2).

$$2 < L/I \leq 2.82 \quad \text{Expression (1)}$$

$$I/W \leq 3.68 \quad \text{Expression (2)}$$

The present invention is an acceleration sensor in which I/W is 3.10 or more.

The present invention is an acceleration sensor in which L/I is 2.4 or more.

The present invention is an acceleration sensor in which the width of each of the beam parts is varied from the frame part toward the weight part, and a minimum width of each of the beam parts is regarded as the width W.

The present invention is an acceleration sensor in which a thickness t of each of the beam parts is between 3 μm and 10 μm.

The present invention is an acceleration sensor in which the weight part includes: a weight bonding part integrally formed with the beam parts; and a weight having a weight base part supported by the weight bonding part, and projecting parts projecting outward from the weight base part; and a thickness of the weight is between 300 μm and 800 μm, and a clearance between the projecting parts and the frame part is 70 μm and 110 μm.

The present invention is an acceleration sensor in which the weight part includes: a weight bonding part integrally formed with the beam parts; and a weight having a weight base part supported by the weight bonding part, and projecting parts projecting outward from the weight base part; and windows are defined by the one frame part and the beam parts, each of the windows being provided at a corner portion thereof with a stopper for restricting an excessive movement of the projecting part.

In the acceleration sensor of the present invention, the width W of each of the beam parts, the length I of each of the beam parts, and the inner frame length L of each of the frame parts satisfy the predetermined relationships. Thus, even when an excessive acceleration up to 10000 G is applied to the acceleration sensor, the beam parts and the weight part can be reliably prevented from being damaged or broken down. Thus, there is produced an effect that the acceleration sensor can have a high reliability. In addition to this effect, when the quotient of I/W is 3.10 or more, the acceleration sensor can have a significantly excellent sensitivity, e.g., a sensitivity of 0.3 mV/g/V or more.

DETAILED DESCRIPTION OF THE INVENTION

Embodiments of the present invention will be described below with reference to the drawings.

Figure 1:
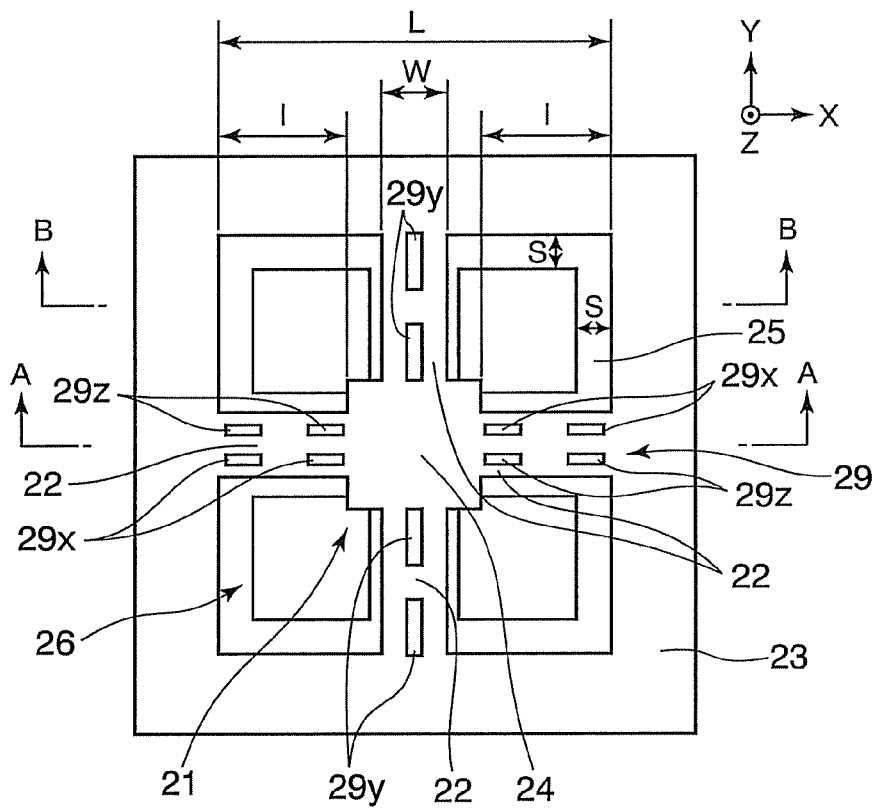
FIG. 1 is a plan view showing an embodiment of an acceleration sensor of the present invention.
Figure 2:
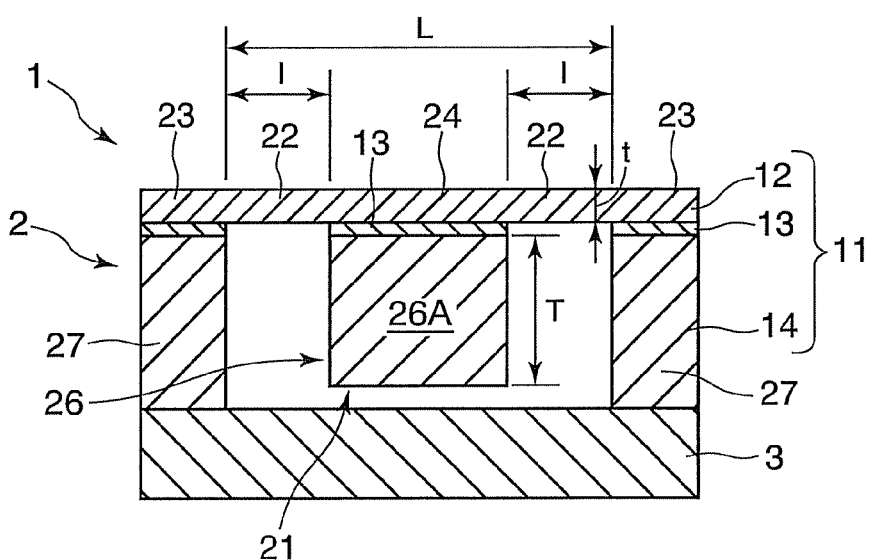
FIG. 2 is a sectional view of the acceleration sensor shown in FIG. 1 when taken along the line A-A.
Figure 3:
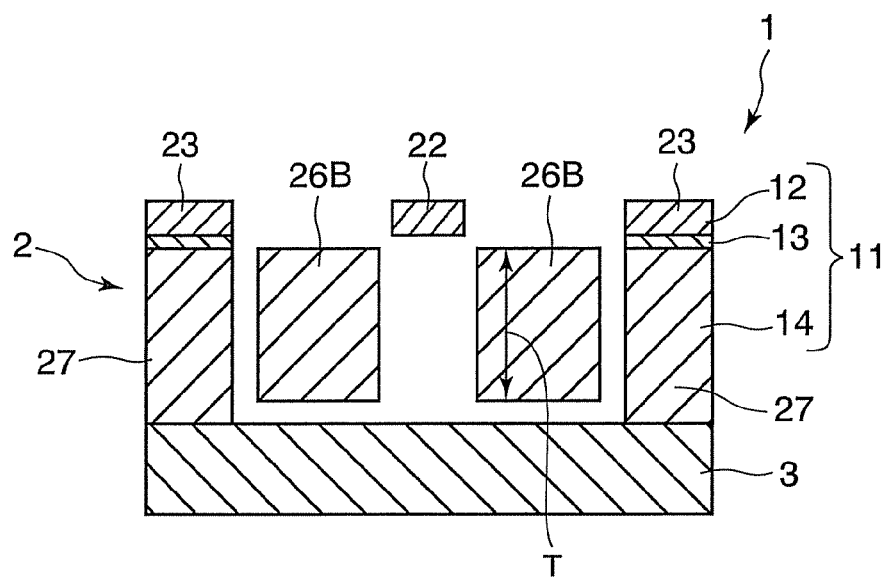
FIG. 3 is a sectional view of the acceleration sensor shown in FIG. 1 when taken along the line B-B.
Figure 4:
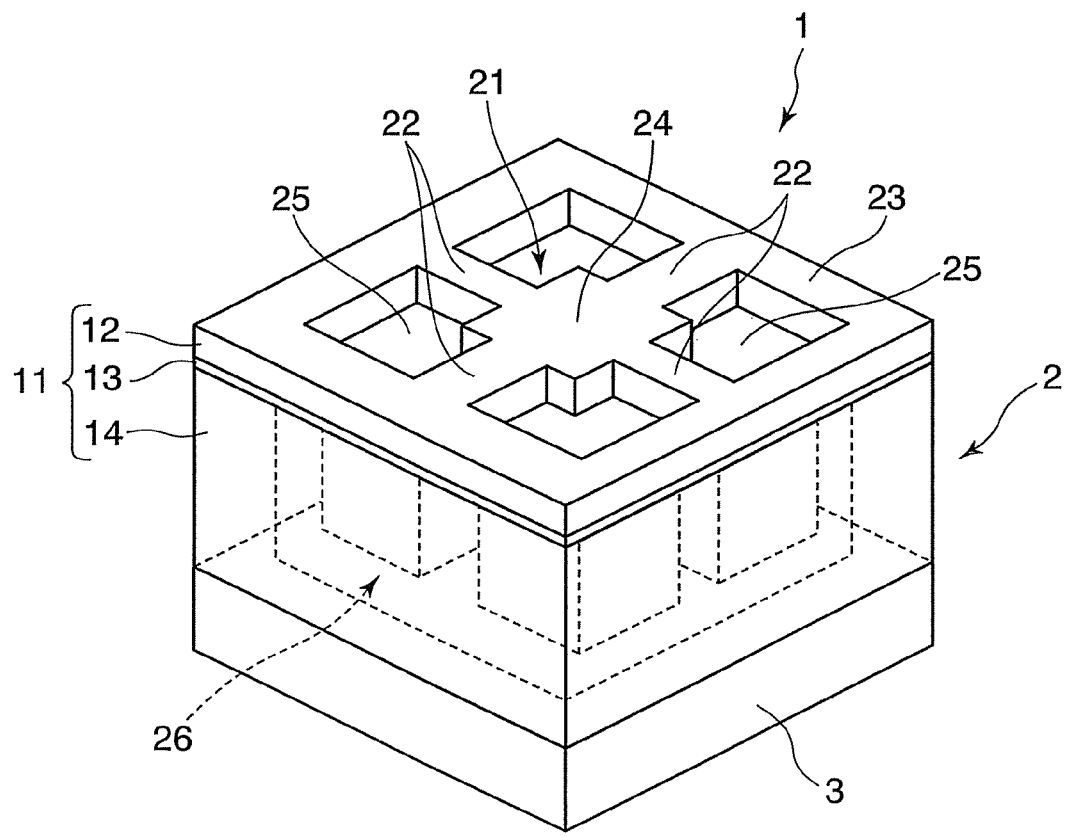
FIG. 4 is a perspective view of the acceleration sensor shown in FIG. 1.
Figure 5:
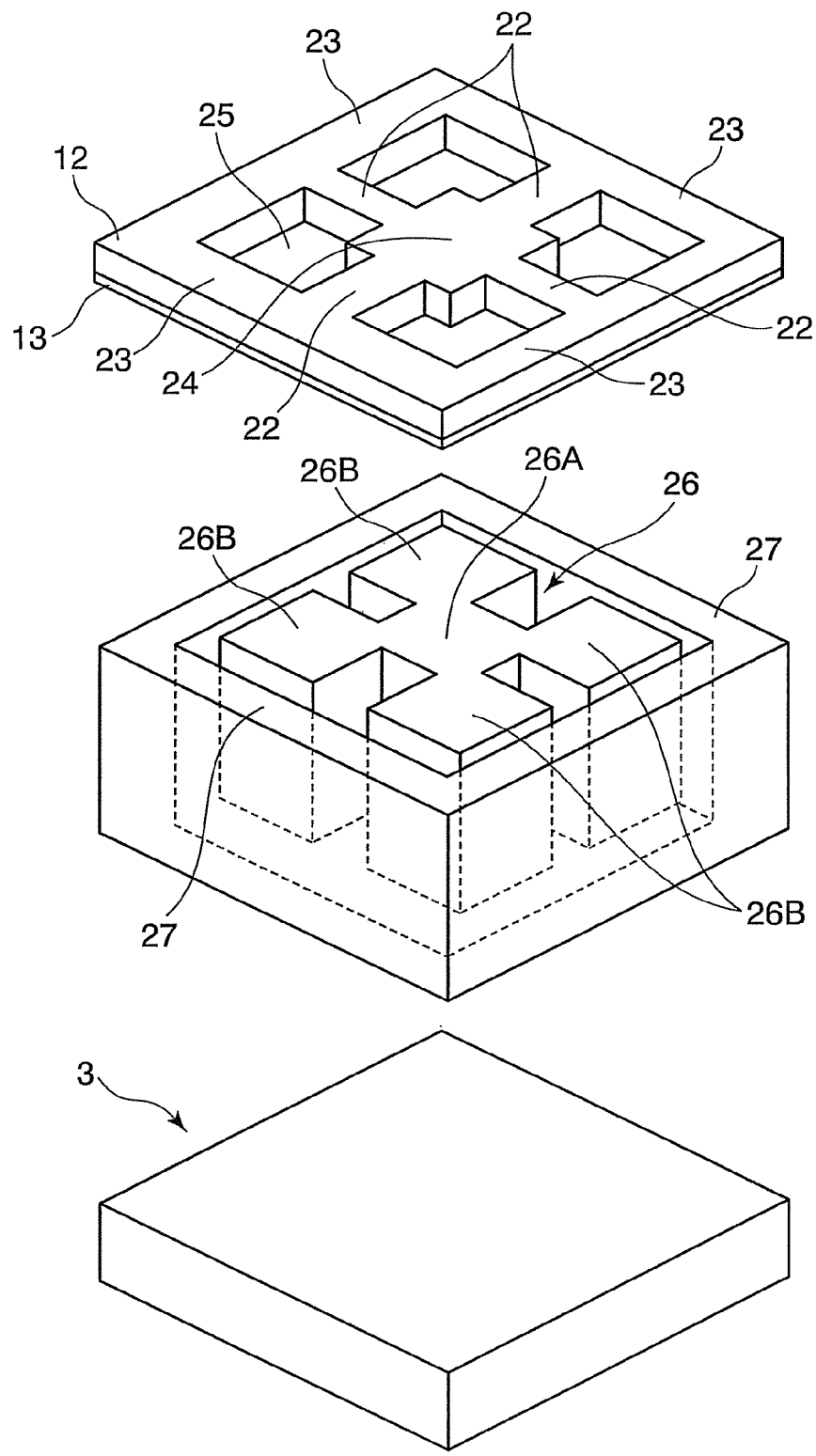
FIG. 5 is a perspective view of the acceleration sensor shown in FIG. 1 in which a silicon oxide layer and a silicon layer (substrate silicon) are separated from each other, and a support substrate and the silicon layer (substrate silicon) are separated from each other.
Figure 6:
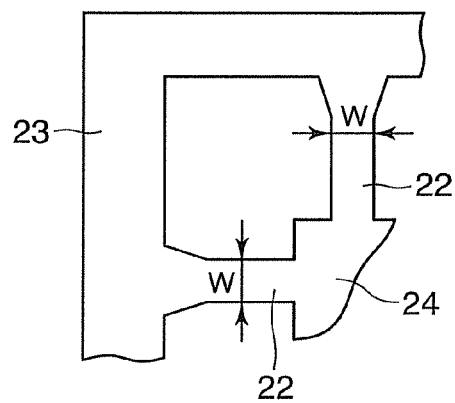
FIG. 6(A) to 6(D) are views for explaining a shape of a beam part.
Figure 6:
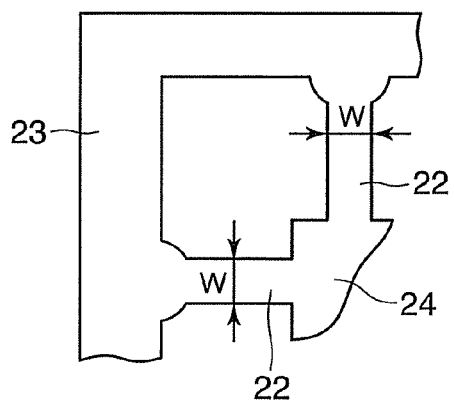
Figure 6:
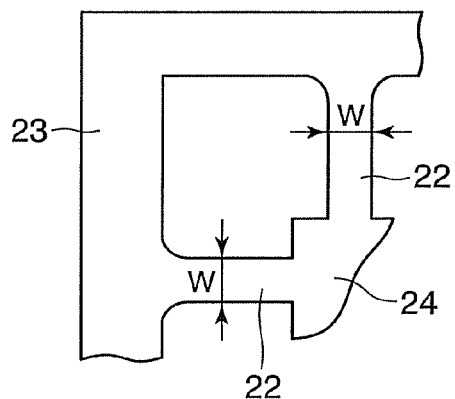
Figure 6:
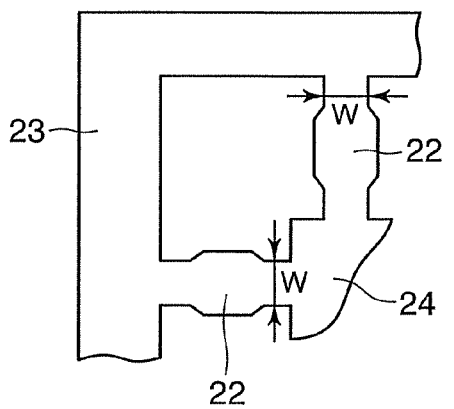

FIG. 1 is a plan view showing an embodiment of an acceleration sensor of the present invention. FIG. 2 is a sectional view of the sensor shown in FIG. 1 when taken along the line A-A. FIG. 3 is a sectional view of the sensor shown in FIG. 1 when taken along the line B-B. In FIGS. 1 to 3, an acceleration sensor 1 includes a sensor body 2, and a support substrate 3 bonded to the sensor body 2. The sensor body 2 is formed of an SOI (Silicon On Insulator) substrate 11 of a three-layered structure in which a silicon oxide layer 13 is interposed between a silicon layer 12 (active layer silicon) and a silicon layer 14 (substrate silicon). The sensor body 2 includes: frame parts 23 and 27; a plurality of, e.g., four beam parts 22 of the same shape, the beam parts 22 projecting inward from the frame parts 23 and 27; and a weight part 21 supported by the beam parts 22. FIG. 4 is a perspective view of the acceleration sensor shown in FIG. 1. FIG. 5 is a perspective view of the acceleration sensor shown in FIG. 1 in which the silicon oxide layer 13 and the silicon layer 14 (substrate silicon) are separated from each other, and the support substrate 3 and the silicon layer 14 (substrate silicon) are separated from each other.

As shown in FIGS. 1 to 5, the silicon layer 12 constituting the sensor body 2 defines a weight bonding part 24 constituting the weight part 21, the four beam parts 22 for supporting the weight bonding part 24, the frame part 23, and four window parts 25 surrounded by the respective beam parts 22 and the frame part 23. Piezoresistors serving as a strain sensing part 29 are arranged on the four beam parts 22. The strain sensing part 29 is provided with four piezoresistors 29x configured to sense an external force in an X-axis direction, four piezoresistors 29y configured to sense an external force in a Y-axis direction, and four piezoresistors 29z configured to sense an external force in a Z-axis direction. The four piezoresistors in the respective axis directions are connected to each other so as to realize bridge circuits.

The silicon layer 14 (substrate silicon) constituting the sensor body 2 defines a weight 26 constituting the weight part 21, and the frame part 27 that is positioned around the weight 26 with an opening therebetween. A thickness of the weight 26 is smaller than that of the frame part 27. The weight 26 is composed of a base part 26A and four projecting parts 26B projecting from the base part 26A toward spaces between the crisscrossed beam parts 22 (toward the window parts 25). The base part 26A of the weight 26 is bonded to the weight bonding part 24 of the silicon layer 12 (active layer silicon) through the silicon oxide layer 13. Namely, the weight part 21 is composed of the weight bonding part 24 and the weight 26. The support substrate 3 constituting the acceleration sensor 1 may be made of a glass plate, a silicon plate, a SUS plate, a metal plate containing, e.g., invar (Fe-36% Ni alloy), and an insulation resin plate, for example. A thickness of the support substrate 3 may be suitably set within a range between about 50 µm and about 1000 µm. The acceleration sensor of the present invention may be composed only of the sensor body 2, without the support substrate 3 being provided. In this case, the acceleration sensor is directly mounted on a substrate for package.

In the acceleration sensor 1, when an external force in the direction of the X-axis, the Y-axis, or the Z-axis (see FIG. 1) acts on the weight part 21 supported by the four beam parts 22, the weight part 21 is displaced. This displacement strains the beam parts 22, so that the external force having acted on the weight part 21 is sensed by the strain sensing part (piezoresistors) 29.

In the present invention, it is necessary that a width W of each of the beam parts 22, a length I of each of the beam parts 22, and an inner frame length L of each of the frame parts 23 and 27 satisfy the following relationships of Expressions (1) and (2). Thus, even when an excessive acceleration up to 10000 G is applied, the beam parts 22 and the weight part 21 can be reliably prevented from being damaged or broken down, whereby a reliability of the acceleration sensor 1 can be enhanced.

$$2 < L/I \leq 2.82 \quad \text{Expression (1)}$$

$$I/W \leq 3.68 \quad \text{Expression (2)}$$

When a quotient of L/I surpasses 2.82, or when a quotient of I/W surpasses 3.68, an excellent impact resistance against 10000 G cannot be obtained. Due to the presence of the weight bonding part 24 supported by the beam parts 22, a quotient of L/I is inevitably larger than 2. Preferably, a quotient of L/I is 2.4 or more.

In the drawings, although each of the beam parts 22 has a uniform width, the present invention is not limited thereto. For example, as shown in FIGS. 6(A) to 6(D), the beam part 22 may have a shape in which a width of an area, which is bonded to the frame part 23, is widened (FIGS. 6(A) to 6(C)). Alternatively, the beam part 22 may have a shape in which a width of an intermediate area is widened (FIG. 6(D)). When a width of the beam part 22 is not uniform, the width W of the beam part 22 is regarded as a minimum width of the beam part 22.

Further, in the present invention, a quotient of I/W is preferably 3.10 or more, in order to provide an excellent sensitivity, e.g., a sensitivity of 0.3 mV/g/V or more.

Furthermore, in the present invention, it is preferable that a thickness t of the beam part 22 is within a range between 3 µm and 10 µm, that a thickness T of the weight 26 constituting the weight part 21 is within a range between 300 µm to 800 µm, and that a clearance S between the projecting parts 26B of the weight 26 and the frame part 27 is 70 µm or more.

Figure 7:
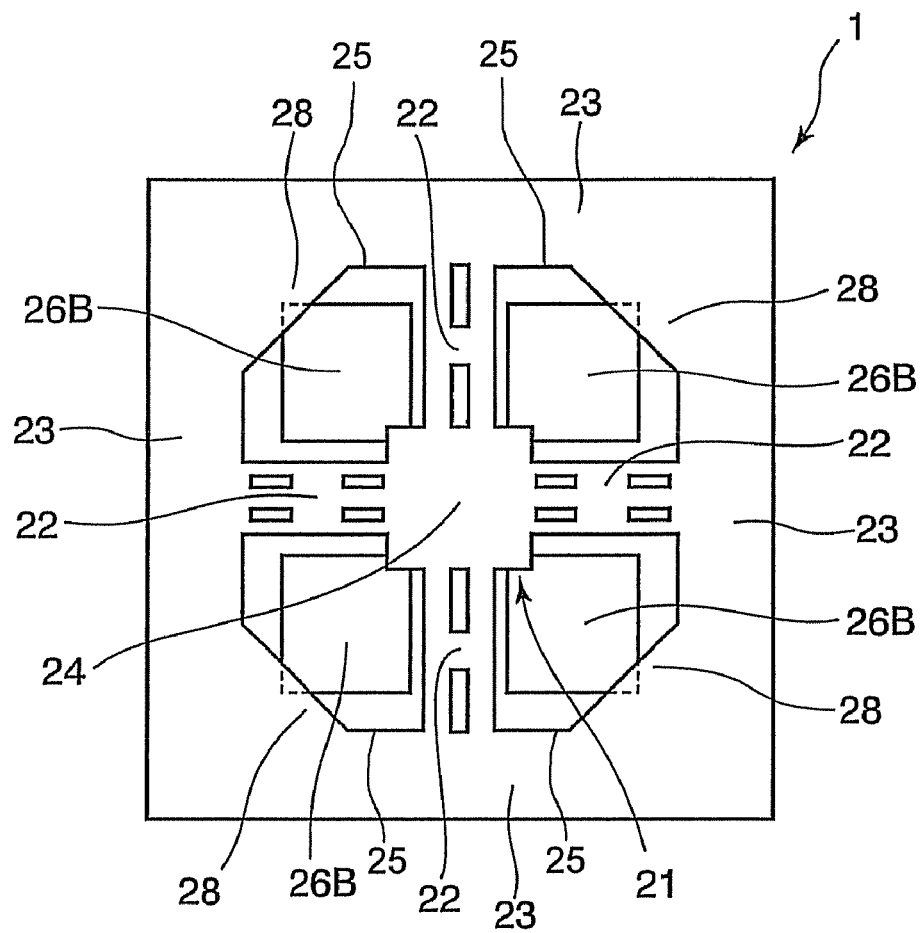
FIG. 7 is a plan view showing another embodiment of the acceleration sensor of the present invention.

The aforementioned embodiment of the acceleration sensor is taken only by way of an example, and the present invention is not limited thereto. For example, as shown in FIG. 7, four window parts 25 surrounded by respective beam parts 22 and a frame part 23 may be provided at corner portions thereof with stoppers 28 formed of a silicon layer 12 (active layer silicon). In this embodiment, when an excessive acceleration is applied to a weight 26, the projecting part 26B of the weight 26 comes into contact with the stopper 28, whereby an excessive displacement of the beam part 22 can be prevented.

Figure 8:
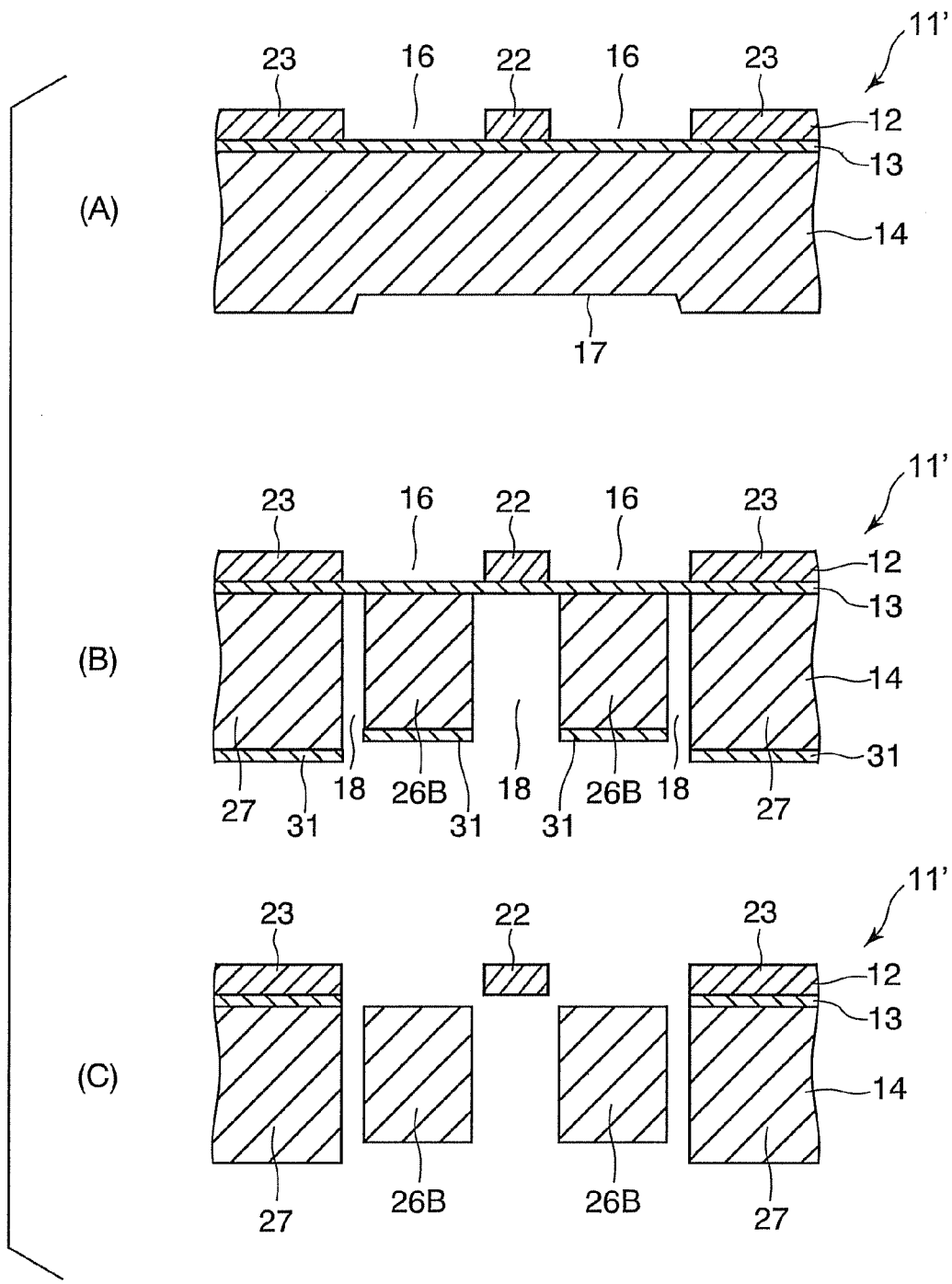
FIGS. 8(A) to 8(C) are views showing an example of a manufacturing process for the acceleration sensor of the present invention.

FIG. 8 is a view showing an example of a manufacturing process for the acceleration sensor of the present invention, in which the sensor body 2 of the above-described acceleration sensor 1 is manufactured by way of an example. FIG. 8 shows the part corresponding to the sectional shape shown in FIG. 3.

In FIG. 8, an SOI wafer 11' of a three-layered structure including the silicon layer 12 (active layer silicon), the silicon oxide layer 13, and the silicon layer 14 (substrate silicon) is subjected to a multifaceted process. At first, areas for forming the beam parts 22, the frame part 23, and the weight bonding part 24 are set in each imposition process, and the strain sensing part 29 is formed on a predetermined location of the silicon layer 12 (active layer silicon) to be formed into the beam parts 22 by a thermal diffusion method or an ion implementation method. Then, grooves 16 for forming the beam parts 22, the frame part 23, and the weight bonding part 24 are formed in the silicon layer 12 (active layer silicon), and a recess 17 for setting a thickness of the weight 26 is formed in the silicon layer 14 (substrate silicon) (FIG. 8(A)). The grooves 16 and the recess 17 are etched through a mask pattern by a DRIE (Deep Reactive Ion Etching) method which is a dry etching method using a plasma. Alternatively, the grooves 16 and the recess 17 may be formed by a sandblast method, a wet etching method, or a femtosecond laser method.

Then, in each imposition process, openings 18 are drilled through a mask pattern 31 from a side of the silicon layer 14 (substrate silicon) (a side of the recess 17) of the SOI wafer 11' until the silicon oxide layer 13 is exposed, so that the weight 26 (base part 26A, projecting parts 26B) and the frame part 27 are formed (FIG. 8(B)). Thereafter, the silicon oxide layer 13 exposed to the openings 18 and the grooves 16 is removed (FIG. 8(C)). Thus, the sensor body 2 can be obtained. The openings 18 are etched through the mask pattern 31 by the DRIE method. In addition, when the silicon oxide layer 13 is removed, there may be employed, for example, a dry etching method using a reactive gas. A method of forming the mask pattern 31 is not particularly limited. For example, the mask pattern 31 may be formed by a photolithography using a photosensitive resist, or may be formed by directly patterning a resin layer or a metal layer by laser-beam drawing.

Thereafter, the support substrate 3 is bonded to the sensor body 2, whereby the acceleration sensor 1 can be obtained. The sensor body 2 and the support substrate 3 may be bonded to each other by anodic bonding, direct bonding, eutectic bonding, or adhesive bonding.

EXAMPLE

Next, the present invention is described in more detail by showing an example.

There was prepared an SOI wafer of a three-layered structure including a silicon layer (active layer silicon) of 5 μm in thickness, a silicon oxide layer of 2 μm in thickness, and a silicon layer (substrate silicon) of 718 μm in thickness. The SOI wafer was then subjected to a multifaceted process. Namely, in each imposition process, grooves for forming beam parts, a frame part, and a weight bonding part were formed in the silicon layer (active layer silicon) by the DRIE (Deep Reactive Ion Etching) method. Values of a width W of each of the beam parts, a length I of each of the beam parts, an inner frame length L of each of the frame parts, a quotient of L/I, and a quotient of I/W, were set to be the values shown in the below Table 1. Then, a recess of 5 μm in depth was formed in the silicon layer (substrate silicon) by the RIE method (see, FIG. 8(A)).

Then, openings were drilled by the DRIE method through a mask pattern from a side of the silicon layer (substrate silicon) (a side of the recess) of the SOI wafer until the silicon oxide layer was exposed, so that a weight (a base part and four projecting parts) and a frame part were formed (see, FIG. 8(B)). A thickness of the thus formed weight was 713 μm, a clearance between the weight and the beam parts was 10 μm, and a clearance between the projecting parts of the weight and the frame part was between 70 μm and 110 μm.

Then, the silicon oxide layer exposed to the openings and the grooves was removed by the dry etching method using a reactive gas (see, FIG. 8(C)). Thus, a sensor body was obtained, with a thickness of the beam part being 5 μm. Thereafter, a support substrate (Pyrex (registered trade mark) glass) was bonded to the sensor body by anodic bonding, whereby an acceleration sensor (Sample 1) was manufactured.

In addition, acceleration sensors (Samples 2 to 9) were manufactured in the same manner as the above Sample 1, but values of a width W of each of the beam part, a length I of each of the beam part, an inner frame length L of each of the frame parts, a quotient of L/I, and a quotient of I/W, were set to be the values shown in the below Table 1.

In this manner, there were manufactured nine types of acceleration sensors (Samples 1 to 9), fifty units of each type of sensor. Then, there were conducted impact tests for these acceleration sensors by applying thereto a 10000 G impact in the Z-axis direction, with the use of an impact tester (manufactured by AVEX Corporation, SM-105-MP). The acceleration sensors having been subjected to the tests were observed by a microscope, and were evaluated based on the below standards. Table 1 shows the impact test results.

<Evaluation Standards for Impact Test>

TABLE 1

| Acceleration Sensor | Inner Frame Length L (μm) | Beam Part Width W (μm) | Beam Part Length I (μm) | L/I | I/W | Impact Test Result |
|---|---|---|---|---|---|---|
| Sample 1 | 790 | 80 | 294 | 2.69 | 3.68 | ○ |
| Sample 2 | 790 | 90 | 290 | 2.72 | 3.22 | ○ |
| Sample 3 | 790 | 90 | 280 | 2.72 | 3.11 | ○ |
| Sample 4 | 790 | 100 | 285 | 2.77 | 2.85 | ○ |
| Sample 5 | 790 | 110 | 280 | 2.82 | 2.55 | ○ |
| Sample 6 | 790 | 70 | 275 | 2.87 | 3.93 | × |
| Sample 7 | 1000 | 120 | 335 | 2.99 | 2.79 | × |
| Sample 8 | 790 | 75 | 284 | 2.78 | 3.79 | × |
| Sample 9 | 790 | 90 | 275 | 2.87 | 3.05 | × |

○: Both the beam part and the weight part are not cracked and/or broken down.
×: At least one of the beam part and the weight part is cracked and/or broken down.

Table 1 apparently shows that the acceleration sensor that does not satisfy any one of Expressions (1) and (2) does not have an impact resistance against 10000 G.

In addition, sensitivities of the four types of acceleration sensors (Samples 1 to 4) having an excellent impact resistance were measured under conditions described below. The results were: Samples 1 to 3 in which a quotient of I/W was 3.1 or more (Sample 1: I/W=3.68; Sample 2: I/W=3.22; and Sample 3: I/W=3.11) had sensitivities of 0.3 mV/g/V or more (Sample 1=0.44 mV/g/V, Sample 2=0.32 mV/g/V, Sample 3=0.31 mV/g/V). However, Sample 4 in which a quotient of I/W was less than 3.1 (I/W=2.8) had a sensitivity of 0.24 mV/g/V.

(Measurement Conditions for Sensitivity)

An acceleration sensor is mounted on an end of a rotatable rod. Then, the rod is rotated, while a voltage is applied to bridge circuits connected to a strain sensing part. Under this state, an inclination of the output voltage (mV) relative to the acceleration (g) is calculated so as to measure a sensitivity of the acceleration sensor.

The present invention can be applied to various fields in which small-sized acceleration sensors with a high reliability are required.

The invention claimed is:

1. An acceleration sensor formed of an SOI substrate of a three-layered structure including a silicon layer (active layer silicon), a silicon oxide layer, and a silicon layer (substrate silicon), the acceleration sensor comprising:
    a frame part;
    a plurality of beam parts, the beam parts projecting inward from the frame part; and
    a weight part supported by the beam parts;
    wherein:
    each of the beam parts is provided with a strain sensing part; and
    a width W of each of the beam parts, a length I of each of the beam parts, and an inner frame length L of the frame part satisfy the following relationships of Expressions (1) and (2)

$$2 < L/I \leq 2.82 \quad \text{Expression (1)}$$

$$I/W \leq 3.68 \quad \text{Expression (2)}$$

wherein the weight includes: a weight bonding part integrally formed with the beam parts; and a weight having a weight base part supported by the weight bonding part, and projecting parts projecting outward from the weight base part; and
    a thickness of the weight is between 300 μm and 800 μm, and a clearance between the projecting parts and the frame part is between 70 μm and 110 μm.

2. The acceleration sensor according to claim 1, wherein I/W is 3.10 or more.

3. The acceleration sensor according to claim 1, wherein L/I is 2.4 or more.

4. The acceleration sensor according to claim 1, wherein the width of each of the beam parts is varied from the frame part toward the weight part, and
a minimum width of each of the beam parts is regarded as the width W.

5. The acceleration sensor according to claim 1, wherein a thickness t of each of the beam parts is between 3 μm and 10 μm.

6. The acceleration sensor according to claim 1; wherein the weight part includes: a weight bonding part integrally formed with the beam parts; and a weight having a weight base part supported by the weight bonding part, and projecting parts projecting outward from the weight base part; and
windows are defined by the one frame part and the beam parts, each of the windows being provided at a corner portion thereof with a stopper for restricting an excessive movement of the projecting part.

* * * * *